(12) United States Patent
Simsek-Ege et al.

(10) Patent No.: US 8,946,076 B2
(45) Date of Patent: Feb. 3, 2015

(54) METHODS OF FABRICATING INTEGRATED STRUCTURES, AND METHODS OF FORMING VERTICALLY-STACKED MEMORY CELLS

(71) Applicant: Micron Technology, Inc., Boise, ID (US)

(72) Inventors: Fatma Arzum Simsek-Ege, Boise, ID (US); Aaron R. Wilson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 6 days.

(21) Appl. No.: 13/835,551

(22) Filed: Mar. 15, 2013

(65) Prior Publication Data

US 2014/0273462 A1  Sep. 18, 2014

(51) Int. Cl.
| | |
|---|---|
| H01L 21/302 | (2006.01) |
| H01L 27/115 | (2006.01) |
| H01L 21/308 | (2006.01) |
| H01L 21/3065 | (2006.01) |
| H01L 21/033 | (2006.01) |

(52) U.S. Cl.
CPC ...... *H01L 27/11578* (2013.01); *H01L 21/3083* (2013.01); *H01L 21/3065* (2013.01); *H01L 21/0334* (2013.01)
USPC ........... 438/622; 438/696; 438/700; 438/702; 438/703; 438/710; 438/719; 438/724

(58) Field of Classification Search
None
See application file for complete search history.

(56) References Cited

U.S. PATENT DOCUMENTS

| | | | | |
|---|---|---|---|---|
| 6,692,903 | B2 * | 2/2004 | Chen et al. | 430/329 |
| 8,187,936 | B2 * | 5/2012 | Alsmeier et al. | 438/264 |
| 8,324,677 | B2 * | 12/2012 | Lee et al. | 257/316 |
| 2004/0115921 | A1 * | 6/2004 | Clevenger et al. | 438/622 |
| 2005/0176237 | A1 * | 8/2005 | Standaert et al. | 438/623 |
| 2006/0264054 | A1 * | 11/2006 | Gutsche et al. | 438/696 |
| 2012/0034785 | A1 * | 2/2012 | Hayashi et al. | 438/706 |
| 2012/0238098 | A1 * | 9/2012 | Uda et al. | 438/700 |
| 2013/0334593 | A1 * | 12/2013 | Seol et al. | 257/324 |

OTHER PUBLICATIONS

U.S. Appl. No. 13/738,147, filed Jan. 10, 2013 by Deepak Thimmegowda et al.

* cited by examiner

*Primary Examiner* — Anita Alanko
(74) *Attorney, Agent, or Firm* — Wells St. John P.S.

(57) ABSTRACT

Some embodiments include methods of forming vertically-stacked memory cells. An opening is formed to extend partially through a stack of alternating electrically insulative levels and electrically conductive levels. A liner is formed along sidewalls of the opening, and then the stack is etched to extend the opening. The liner is at least partially consumed during the etch and forms passivation material. Three zones occur during the etch, with one of the zones being an upper zone of the opening protected by the liner, another of the zones being an intermediate zone of the opening protected by passivation material but not the liner, and another of the zones being a lower zone of the opening which is not protected by either passivation material or the liner. Cavities are formed to extend into the electrically conductive levels along sidewalls of the opening. Charge blocking dielectric and charge-storage structures are formed within the cavities.

26 Claims, 14 Drawing Sheets

METHODS OF FABRICATING INTEGRATED STRUCTURES, AND METHODS OF FORMING VERTICALLY-STACKED MEMORY CELLS

TECHNICAL FIELD

Methods of fabricating integrated structures, and methods of forming vertically-stacked memory cells.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory. A NAND cell unit comprises at least one selecting device coupled in series to a serial combination of memory cells (with the serial combination commonly being referred to as a NAND string). Example NAND architecture is described in U.S. Pat. No. 7,898,850. NAND architecture may be configured to comprise vertically-stacked memory cells. Fabrication of the vertically-stacked memory cells may comprise forming openings through a tall stack of alternating electrically conductive levels and electrically insulative levels, which becomes increasingly difficult with higher aspect ratio and smaller critical dimensions of the openings. FIGS. 1 and 2 describe some of the difficulties encountered during fabrication of such openings.

FIG. 1 shows a semiconductor construction 10 comprising a stack 16 of alternating electrically insulative levels 18 and electrically conductive levels 20. The electrically conductive levels 20 may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, the electrically conductive levels 20 may comprise n-type doped polycrystalline silicon (i.e., n-type doped polysilicon). The electrically insulative levels 18 may, for example, comprise silicon dioxide.

The levels 18 and 20 may be of any suitable thicknesses; and may, for example, have thicknesses within a range of from about 10 nm to about 300 nm. In some applications, the levels 18 may be thinner than the levels 20. For instance, levels 18 may be about 20 nm thick and levels 20 may be about 30 nm thick.

The electrically conductive levels 20 may be utilized to pattern control gates of flash devices. In such applications, a vertical string of memory cells (such as, for example, a vertical NAND string of memory cells) may be fabricated, with the number of memory cells in each string being determined by the number of electrically conductive levels 20. The stack may comprise any suitable number of electrically conductive levels. For instance, the stack may have 8 electrically conductive levels, 16 electrically conductive levels, 32 electrically conductive gate levels, 64 of electrically conductive levels, etc.

The stack is over an etchstop material 14, which is supported by a base 12. A break is provided between the etchstop material 14 and the base 12 to indicate that there may be additional materials and/or integrated circuit structures between the base and the etchstop material. The etchstop material may comprise, for example, aluminum oxide.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A hardmask material 22 is over stack 16, and a carbon-containing material 24 is over the hardmask material. Hardmask material 22 may comprise, for example, silicon nitride. The carbon-containing material 24 may comprise, for example, amorphous carbon.

FIG. 2 shows a patterned mask 26 provided over material 24. The mask defines an opening 28 which is patterned into materials 22 and 24; and such opening is then extended through stack 16 with an etch. The mask 26 may comprise a lithographic mask (e.g., photolithographically-patterned photoresist), or a mask formed with sub-lithographic processing (e.g., pitch multiplication methodologies).

Numerous problems are encountered in extending opening 28 into the stack 16. For instance, divots (or notches) 30 form where over-etching of dielectric material of levels 18 has occurred; bowing 32 (or other anomalies in the overall shape of the opening) occur, and excessive narrowing 34 occurs at the base of the opening. Such problems become increasing severe with increasing aspect ratios associated with higher levels of integration. It would be desired to develop methods which alleviate or prevent some or all of the problems described with reference to FIG. 2.

DETAILED DESCRIPTION OF THE ILLUSTRATED EMBODIMENTS

In some embodiments, new liner technologies are utilized to alleviate or prevent the problems described above in the "Background" section. Example embodiments are described with reference to FIGS. 3-14.

Figure 1:
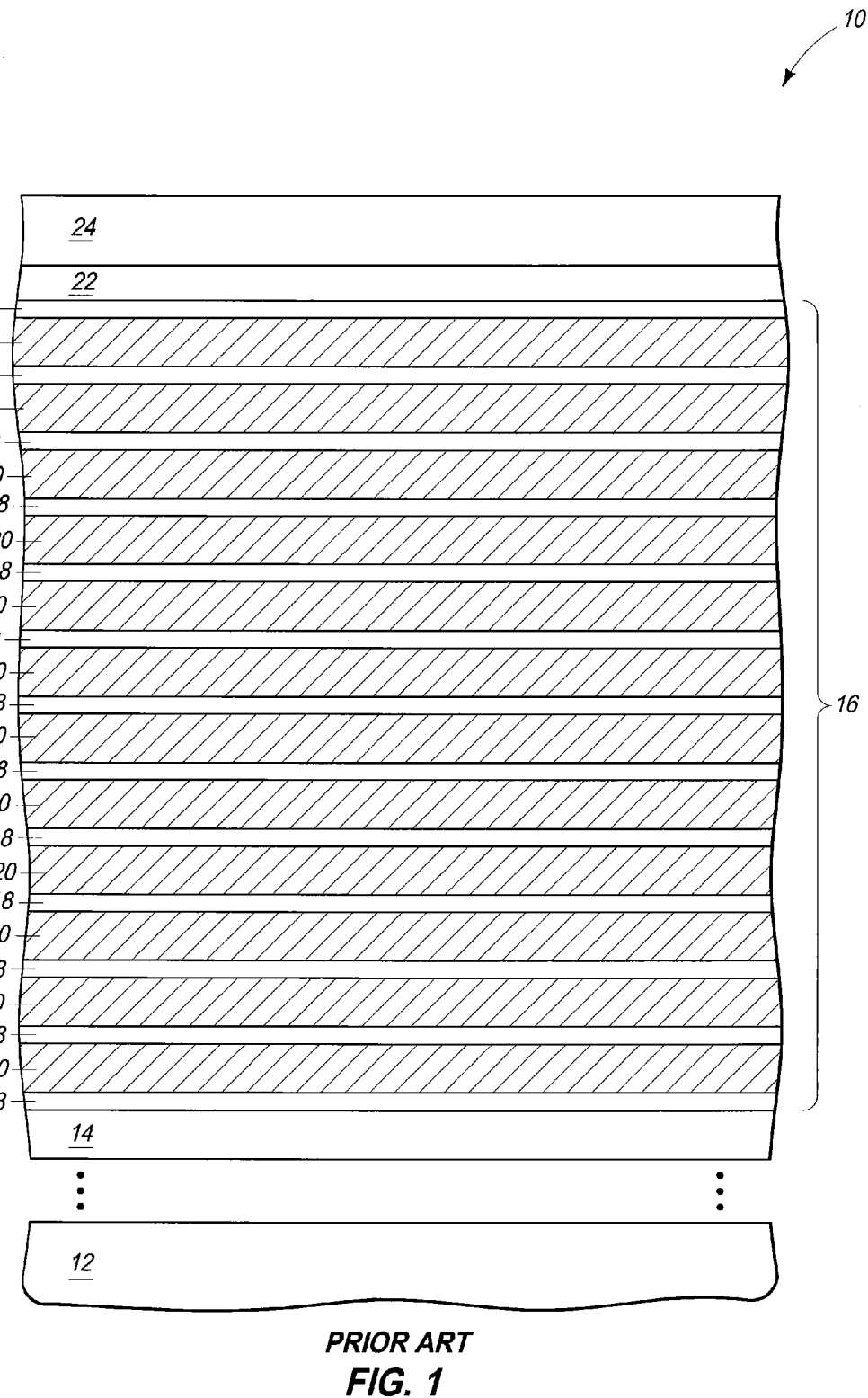
FIGS. 1 and 2 are diagrammatic cross-sectional views of a semiconductor construction at process stages of a prior method of forming integrated structures.
Figure 3:
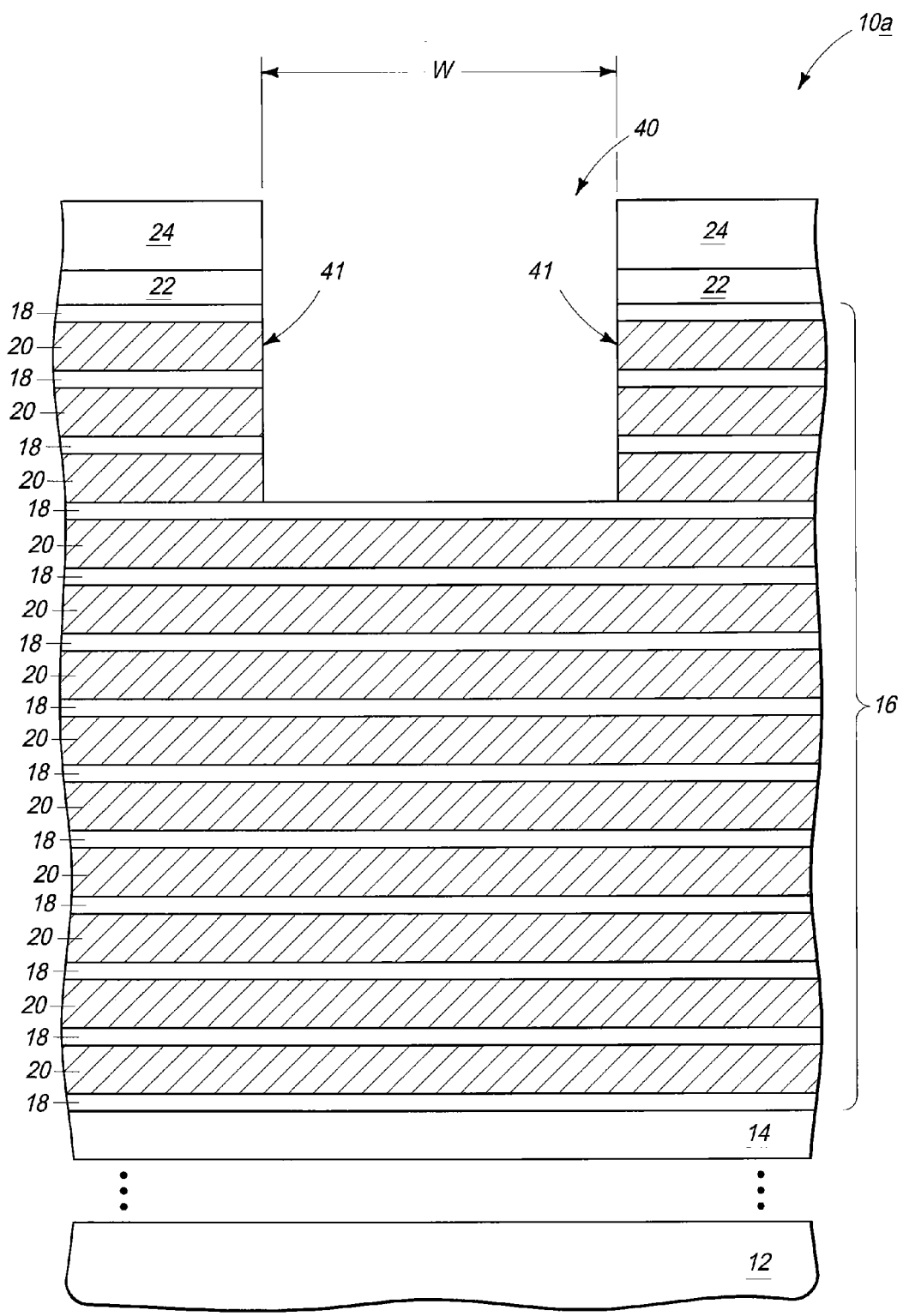
FIGS. 3-10 are diagrammatic cross-sectional views of a semiconductor construction at process stages of an example embodiment method of forming integrated structures. The processing stage of FIG. 3 may follow that of FIG. 1.

Referring to FIG. 3, a semiconductor construction 10a is shown at a processing stage which may follow the prior art processing stage described above with reference to FIG. 1. The construction 10a comprises the stack 16 of alternating electrically insulative levels 18 and electrically conductive levels 20. The alternating levels 18 and 20 are example alternating levels that may be utilized in some embodiments. The levels 18 and 20 may be more generally referred to as first and second levels, respectively, to indicate that the levels may or may not be the illustrated electrically insulative levels and electrically conductive levels. In some embodiments, levels 18 may comprise, consist essentially of, or consist of silicon dioxide; and levels 20 may comprise, consist essentially, or consist of conductively-doped silicon (for instance, conductively-doped polycrystalline silicon).

The stack 16 is formed over etchstop material 14, which is supported by base 12.

The hardmask material 22 and carbon-containing material 24 are over the stack 16.

An opening 40 is formed to extend through materials 22 and 24, and partially through the stack 16. The location of the opening may be defined by a patterned mask (not shown) such as a mask analogous to the prior art mask 26 shown in FIG. 2. The opening may be formed with any suitable etch or combination of etches. For instance, in some embodiments a first etching composition may be utilized to extend the opening through the hardmask 22, and then a second etching composition may be utilized to extend the opening partially through stack 16. The etching composition utilized to extend the opening partially through stack 16 may comprise halogen and/or carbon; and in some embodiments may comprise one or more of HBr, $CH_2F_2$, $CH_4$, $C_2H_2$, $H_2$, $NF_3$, $C_4F_8$, $C_4F_6$, $O_2$, Ar, $CHF_3$, $CH_3F$, $BCl_3$ and $SF_6$.

The opening 40 has a width "W". In some embodiments, such width may be less 100 nm, less than 80 nm, or less than 60 nm. For instance, in some embodiments such width may be within a range of from about 50 nm to about 80 nm.

The opening 40 may be formed to any suitable depth within stack 16. For instance, in some embodiments the opening may be formed to a depth which is within a range of from about one-third of the thickness of stack 16 to about two-thirds of the thickness of the stack.

The opening 40 has sidewalls 41 along stack 16, and in the shown embodiment such sidewalls also extend along hardmask material 22 and carbon-containing material 24. The opening may be a closed shape when viewed from above (for instance, a circle, ellipse, rectangle, square, etc.) so that the illustrated sidewalls 41 are part of a continuous sidewall that extends around such closed shape.

Figure 4:
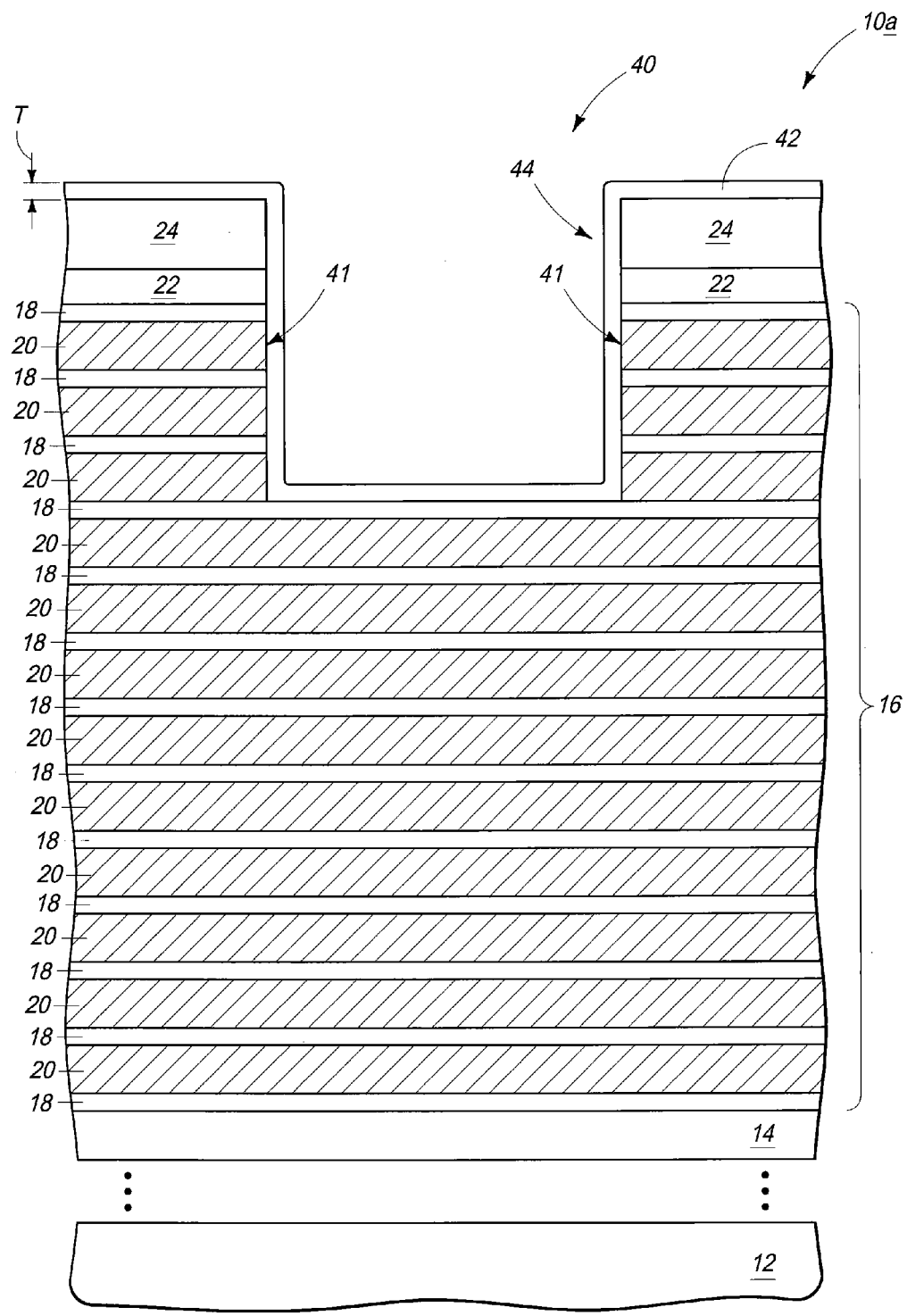

Referring to FIG. 4, a liner 44 of material 42 is formed within opening 40. The liner material 42 extends along sidewalls 41, and also along a bottom of opening 40. The liner material may comprise any suitable composition or combination of compositions. In some embodiments, the liner is sacrificial and accordingly may comprise any of a wide variety of materials, including one or more of electrically conductive materials, semiconductor materials, and electrically insulative materials. In some embodiments, the liner material may comprise, consist essentially of, or consist of one or more of tungsten silicide, titanium nitride, silicon nitride, carbon and polycrystalline silicon. In some embodiments, the liner material may additionally or alternatively comprise, consist essentially of, or consist of one or more oxides having dielectric constants greater than the dielectric constant of silicon dioxide. Such oxides may include, for example, aluminum oxide, hafnium oxide, zirconium oxide, hafnium silicate, zirconium silicate, etc. The liner material may be of an appropriate composition to adhere to the materials 22 and 24, as well as to the materials of stack 16.

The liner material 42 may have any suitable thickness "T", and in some embodiments such thickness may be within a range of from greater than 0 nanometers (nm) to about 20 nm; such as, for example, within a range of from about 4 nm to about 10 nm. The liner material may be formed with any suitable methodology, including, for example, one or more of atomic layer deposition (ALD), chemical vapor deposition (CVD) and physical vapor deposition (PVD). In some embodiments, the liner material may be formed with processing that does not exceed about 600° C. in order to avoid undesired thermal degradation of materials that may be associated with construction 10a.

Figure 5:
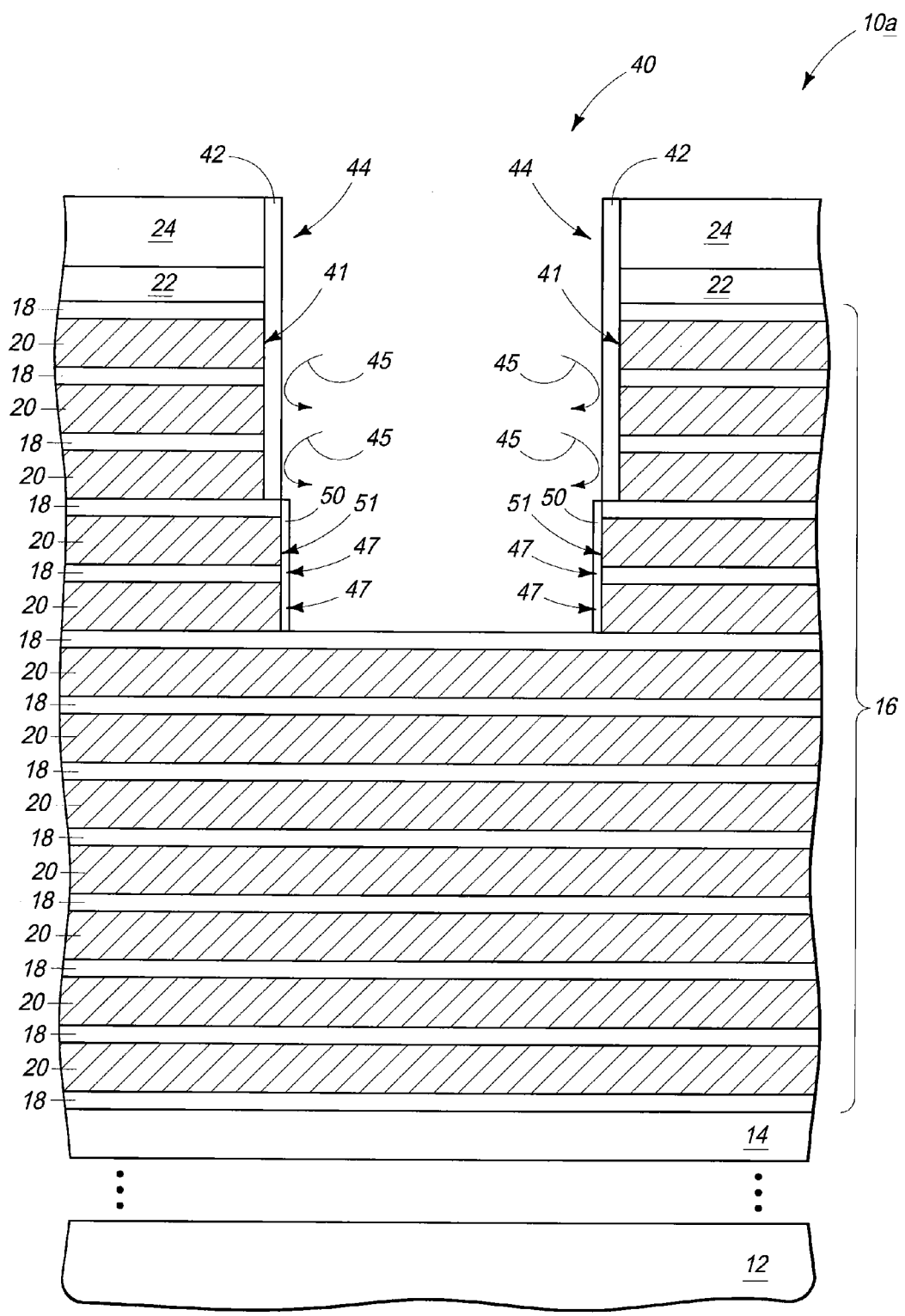

Referring to FIG. 5, liner material 42 is removed from along the bottom of opening 40, and the opening 40 is extended into stack 16. In some embodiments, anisotropic etching conditions are utilized which are suitable to both remove the liner material and to penetrate through the levels 18 and 20 of stack 16.

In some embodiments, the stack 16 may comprise alternating levels 18 and 20 of silicon dioxide and conductively-doped silicon; the liner may comprise one or more of silicon nitride, carbon, polycrystalline silicon, titanium nitride and tungsten silicide; and the etching conditions may utilize one or more of HBr, $CH_2F_2$, $CH_4$, $C_2H_2$, $H_2$, $NF_3$, $C_4F_8$, $C_4F_6$, $O_2$, Ar, $CHF_3$, $CH_3F$, $BCl_3$ and $SF_6$ in an anisotropic etch. The etching conditions may be suitable for removing liner material 42, as well as for removing materials of levels 18 and 20. However, the anisotropic etching will remove liner material 42 from horizontal surfaces (specifically from over a top surface of material 24, and from the bottom of the opening 40 in the shown embodiment) faster than from vertical surfaces (specifically, the surfaces along sidewalls 41). In some embodiments, the etching conditions may include plasma.

In some embodiments, the anisotropic etching removes some of the liner material 42 from along vertical surfaces (as diagrammatically illustrated using arrows 45) and then redeposits such liner material along surfaces of stack 16 exposed beneath liner 44 (as diagrammatically illustrated using arrows 47). The redeposited liner material may be a passivation material 50 which protects sidewalls 51 of regions of opening 40 beneath liner 44. For instance, if the liner 44 comprises silicon nitride, the passivation material 50 may comprise redeposited nitrogen. In some embodiments, the regions of opening 40 beneath the liner may be referred to as a second opening, and the initial opening 40 formed at the processing stage of FIG. 3 may be referred to as a first opening.

Figure 2:
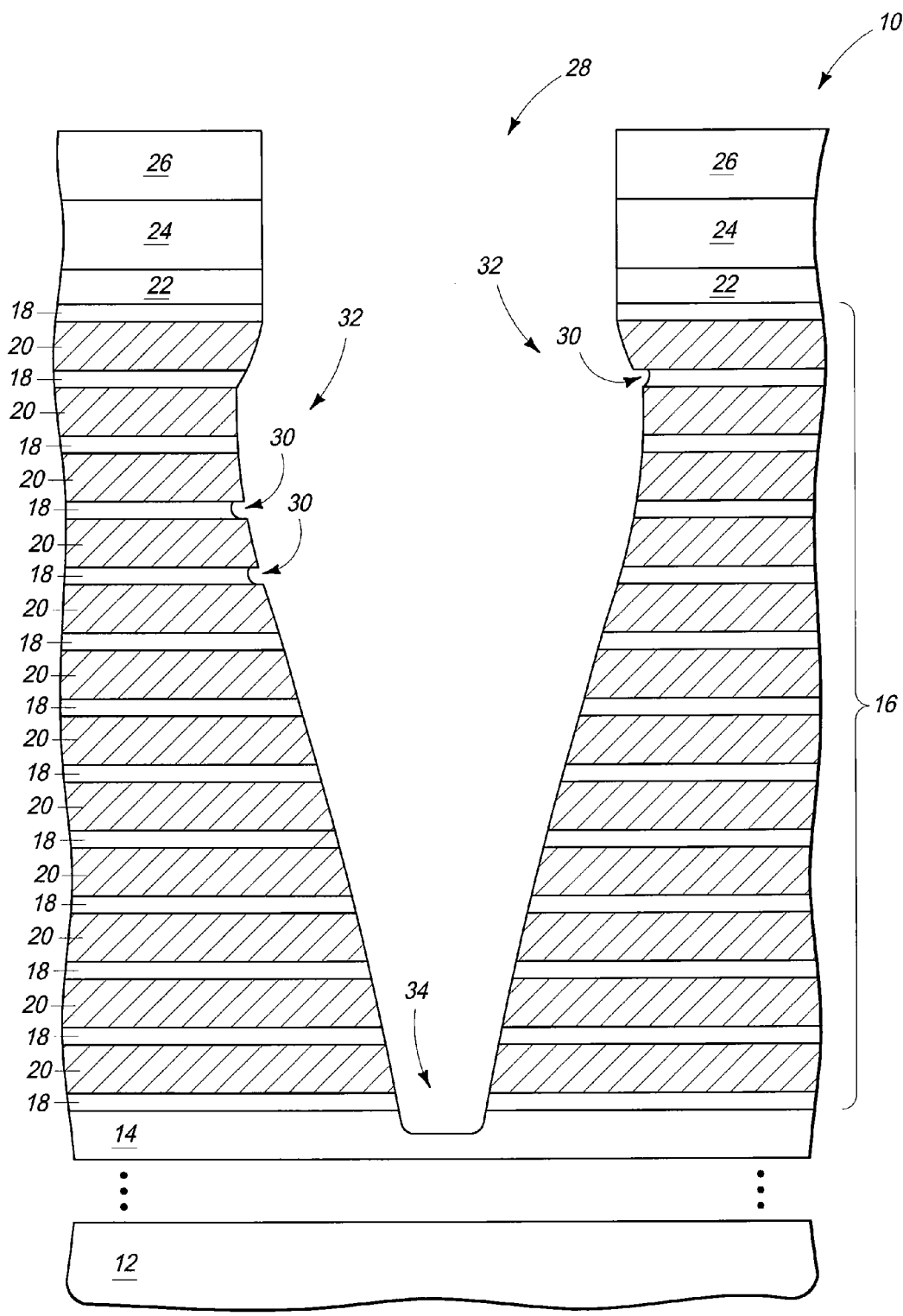

An advantage of the formation of passivation material 50 is that such can protect materials 16 and 18 along sidewalls of opening 40 from being over-etched, which may alleviate or prevent some of the problems described above in the "Background" section; such as the divots 30 and the bowing 32 that are shown in prior art FIG. 2. Another advantage of the formation of passivation material 50 is that such may improve effectiveness of etching within openings 40 by limiting undesired reaction of the etchant with sidewalls of the opening. Specifically, etchant that reacts with sidewalls to form divots or bowing may be depleted in reactive material so that the etch becomes less effective for extending the opening downward. The passivation material 50 can preclude undesired reactions with sidewalls of the opening, which may enable more effective etching from the bottom of the opening. Such can reduce the undesired narrowing of the bottom of the opening described above with reference to prior art FIG. 2.

Figure 6:
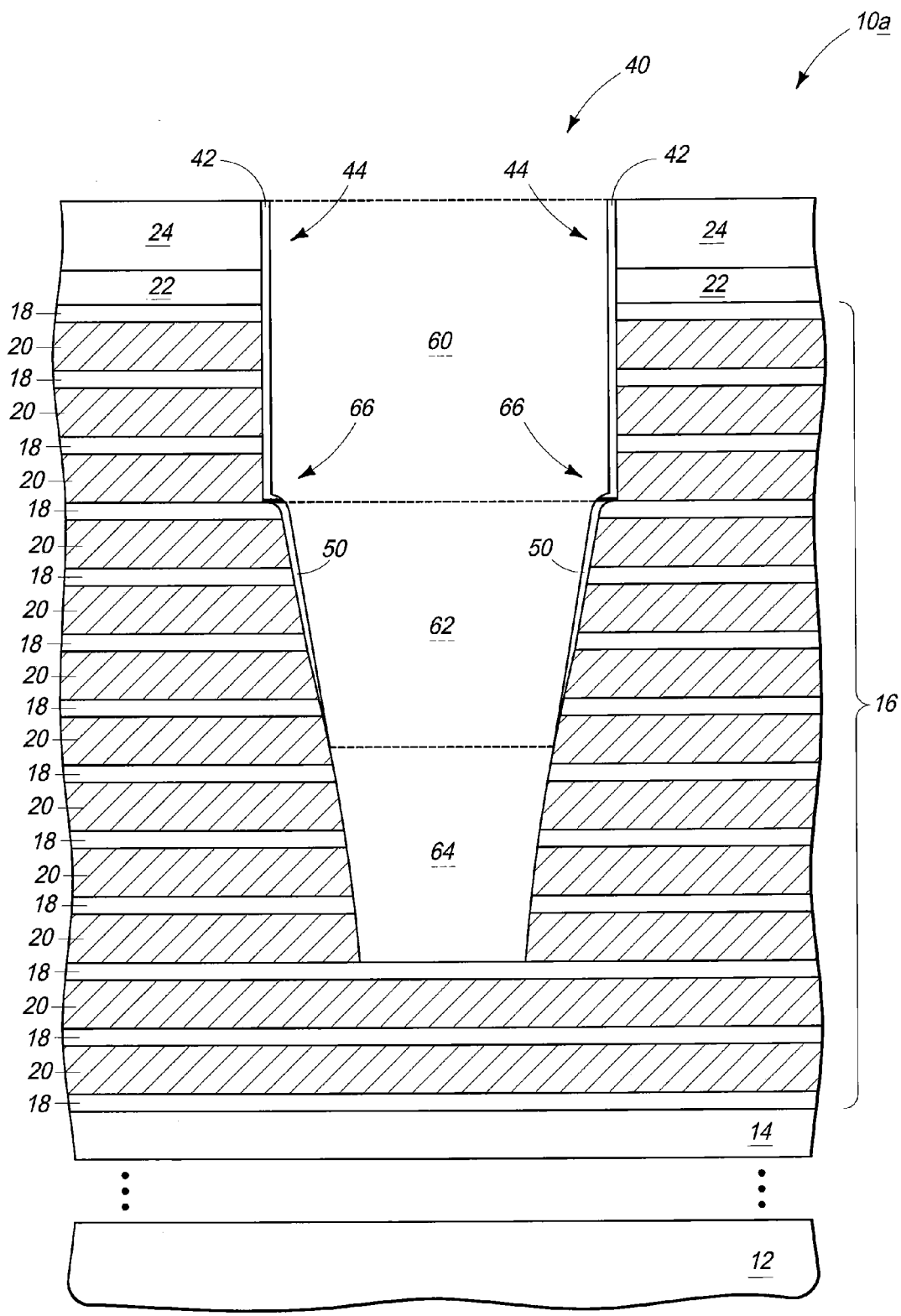

The liner 44 is consumed as opening 40 is extended deeper into stack 16. FIG. 6 shows construction 10a at a processing stage subsequent to that of FIG. 5 and shows opening 40 deeper, while liner 44 is thinner. The passivation material 50 lines a region of the opening beneath liner 44, but does not line the deepest region of the opening. Accordingly, the processing stage of FIG. 6 shows three zones formed within opening 40 during the etch through stack 16. Specifically, an upper zone 60 corresponds to a region of the opening in which sidewalls are protected by liner 44, an intermediate zone 62 corresponds to a region of the opening in which sidewalls are protected by passivation material 50 but not the liner, and a lower zone 64 corresponds to a region of the opening in which sidewalls are not protected by either the liner or the passivation material. Dashed lines are provided to diagrammatically illustrate boundaries of the zones.

A ridge 66 is illustrated to occur at a region where the first zone 60 transitions into the second zone 62; and specifically the ridge is illustrated to be adjacent the bottom of liner 44. Such ridge is a minor perturbation on the overall shape of the opening, and is not problematic to the same extent that the defects described above with reference to FIG. 2 are problematic. Although there appear to be two ridges in the cross-section of FIG. 6, the opening 40 may have a closed shape when viewed from above (as described previously), and accordingly the ridge 66 may be a continuous ridge that extends entirely around the opening.

Figure 7:
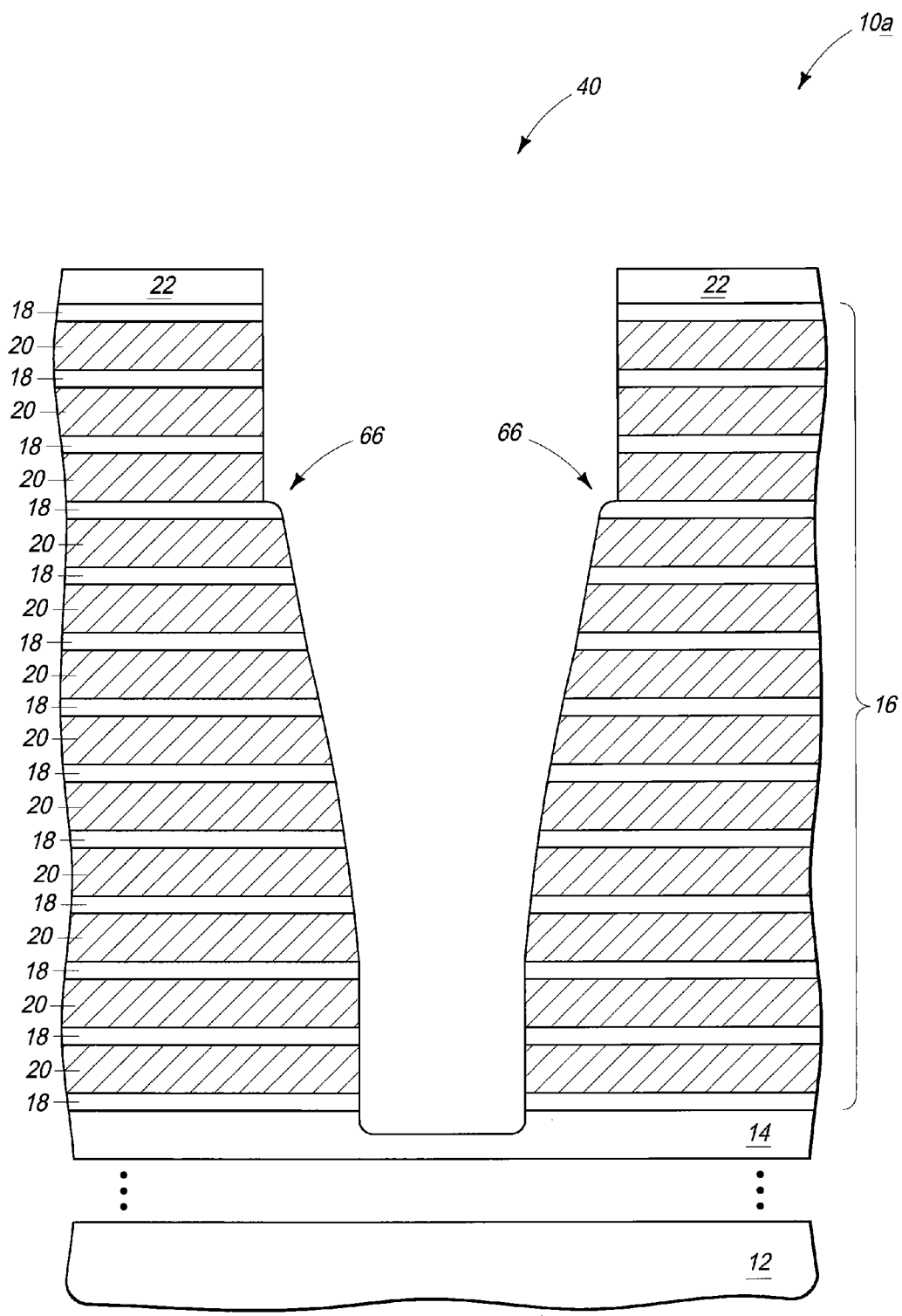

Referring to FIG. 7, construction 10a is shown at the conclusion of an etch through stack 16. The etch has partially penetrated into etchstop material 14. In other embodiments, the etch may stop at an upper surface of etchstop material 14 rather than penetrating into the etchstop material; and in yet other embodiments the etchstop material may be omitted or replaced with a material which is entirely penetrated by the etch.

In the illustrated embodiment, the liner material 42 (FIG. 6) and passivation material 50 (FIG. 6) are entirely consumed by the time that the etch has penetrated entirely through stack 16. In other embodiments, the liner material and/or passivation material may be less than entirely consumed, and may be removed with a subsequent etch.

The opening 40 may have a high aspect ratio, such as an aspect ratio in excess of 30, in excess of 40, etc. (where aspect ratio refers to the depth of an etched area divided by diameter of a circular opening, or divided by the width of a non-circular opening or trench). In some embodiments, opening 40 may have a depth in excess of 3000 nm, and a width of less than 80 nm, less than 60 nm, etc. The opening 40 of FIG. 7 has a better configuration than the prior art opening 28 of FIG. 2. Specifically, the opening 40 of FIG. 7 lacks the divots 30 and bowing 32 of the opening 28 of FIG. 2, and has less narrowing at the bottom than does the prior art opening of FIG. 2.

The opening 40 of FIG. 7 retains the ridge 66 in the shown embodiment. In some embodiments, it may be advantageous to utilize the processing of FIGS. 3-7 to penetrate partially through a stack, and to then repeat such processing at least one additional time to penetrate the remainder of the way to the stack. Each time that the processing is repeated, there may be a ridge analogous to the ridge 66 formed at a location where there had been the bottom of a liner (analogous to the liner 44 of FIG. 6).

The material 24 (FIG. 6) is shown to be entirely removed at the conclusion of the etch utilized to form opening 40. In other embodiments, some of the material 24 may remain.

The stacked levels 18 and 20 may be utilized for fabrication of integrated structures, such as, for example, memory structures, wiring, logic structures, etc. In some embodiments the stacked levels may be utilized for forming vertically-stacked memory cells, as described with reference to FIGS. 8-10.

Figure 8:
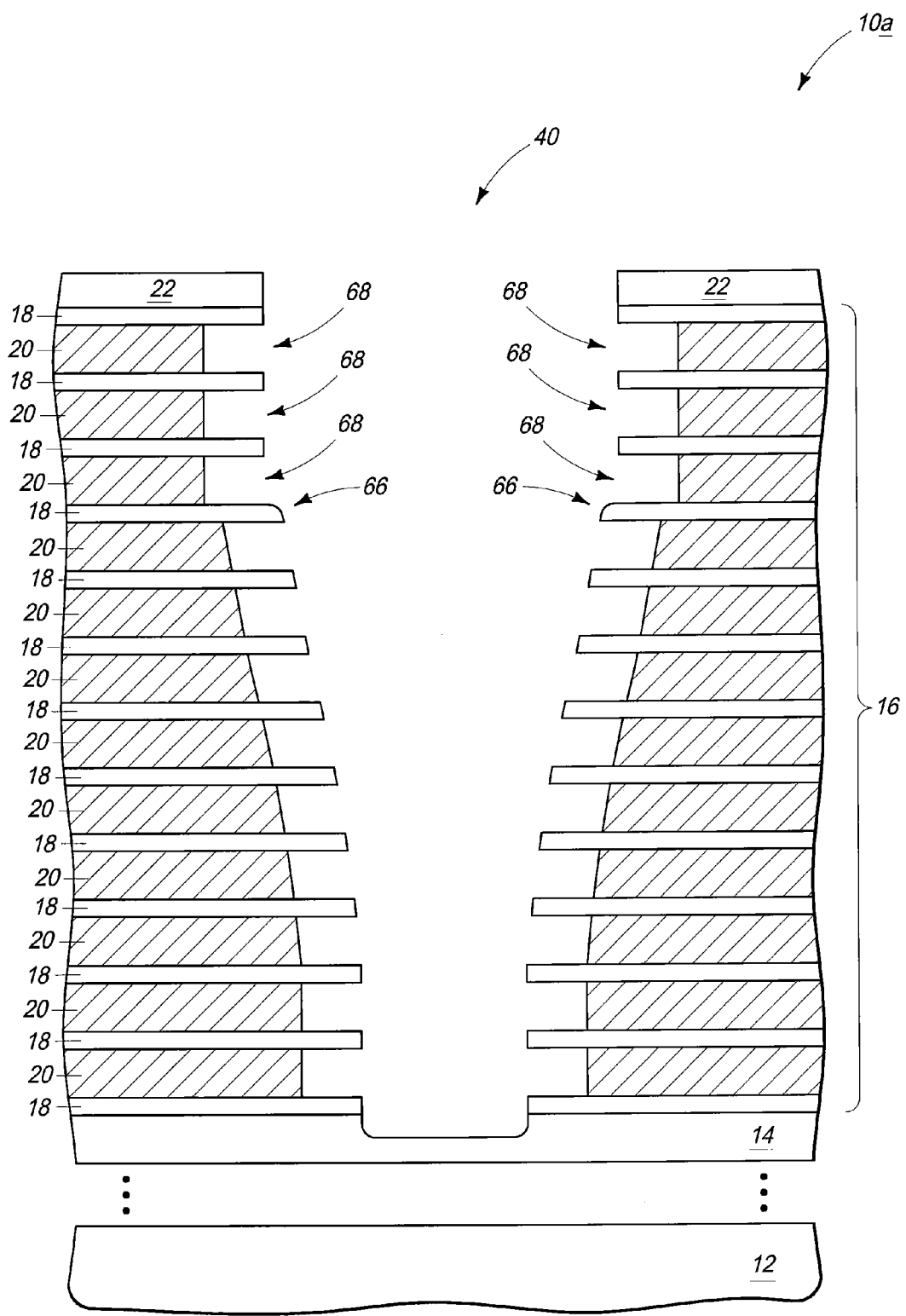

Referring to FIG. 8, cavities 68 (only some of which are labeled) are formed to extend into the electrically conductive levels 20. Such cavities may be formed with an isotropic etch selective for the material of conductive levels 20 relative to the material of insulative levels 18. In some embodiments, conductive levels 20 comprise conductively-doped silicon. In such embodiments, liner material 42 (FIG. 6) may comprise material which is which is substantially entirely removed during the etch utilized to extend opening 40 through stack 16, but which leaves some residual material within the opening. Such residual material may then be removed during the formation of cavities 68. For instance, the liner may comprise polycrystalline silicon, and any residual material of the liner may be removed during the isotropic etch into the silicon of levels 20.

In the shown embodiment, evidence of ridges 66 remains along some of the levels 18 at the processing stage of FIG. 8.

Figure 9:
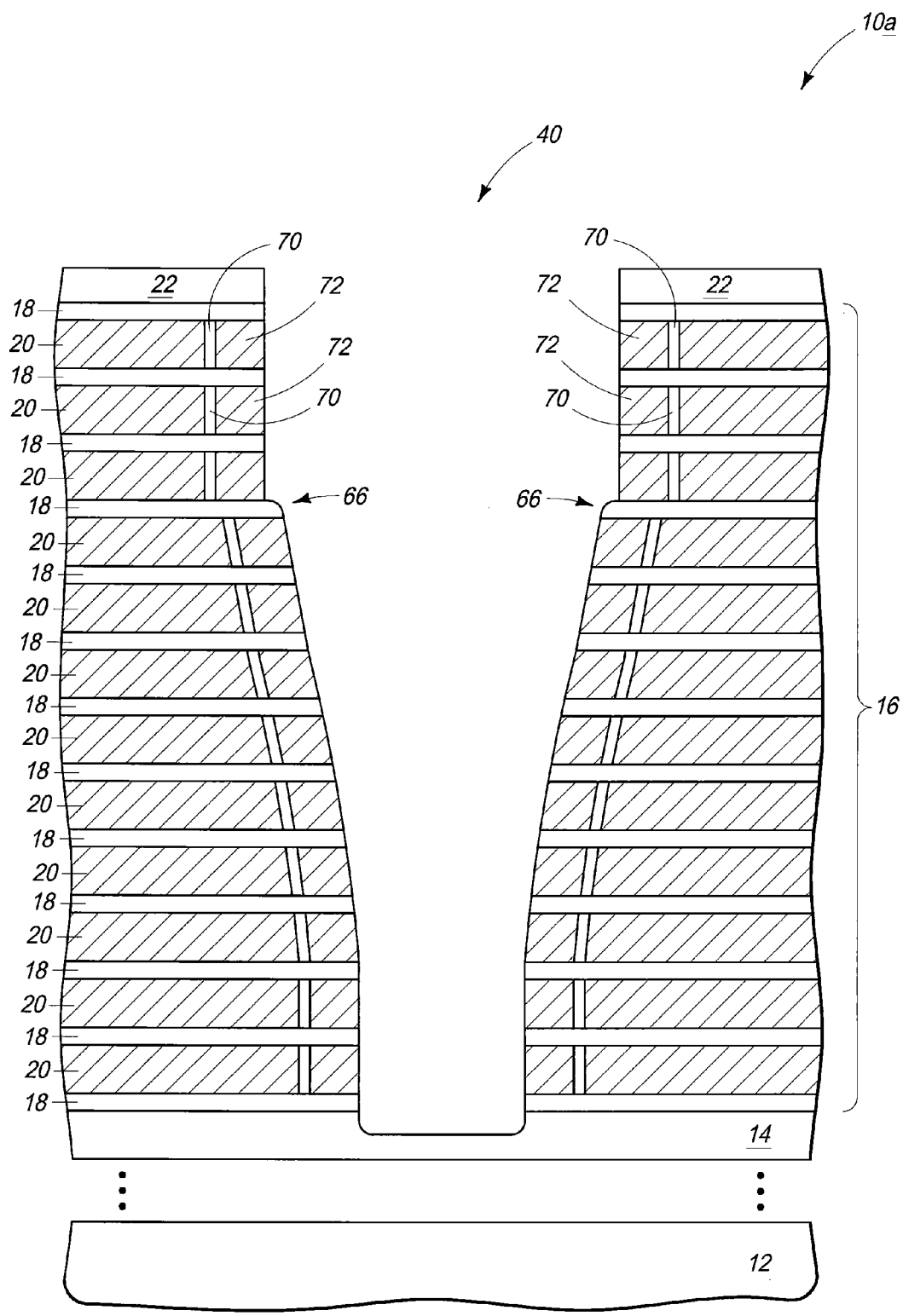

Referring to FIG. 9 charge blocking dielectric 70 (only some of which is labeled) and charge-storage structures 72 (only some of which are labeled) are formed within cavities 68 (FIG. 8). The charge blocking dielectric may comprise any suitable composition or combination of compositions; and in some embodiments may comprise one or more of silicon nitride, silicon dioxide, hafnium oxide, zirconium oxide, etc. The charge-storage material may comprise any suitable composition or combination of compositions; and in some embodiments may comprise floating gate material (for instance, doped or undoped silicon) or charge-trapping material (for instance, silicon nitride, metal dots, etc.). In some embodiments, charge storage structures may not be formed in all of the cavities. For instance, either or both of the depicted top and bottom conductive levels of the stack may be utilized as gates for drain and/or source select transistors in some embodiments.

Figure 10:
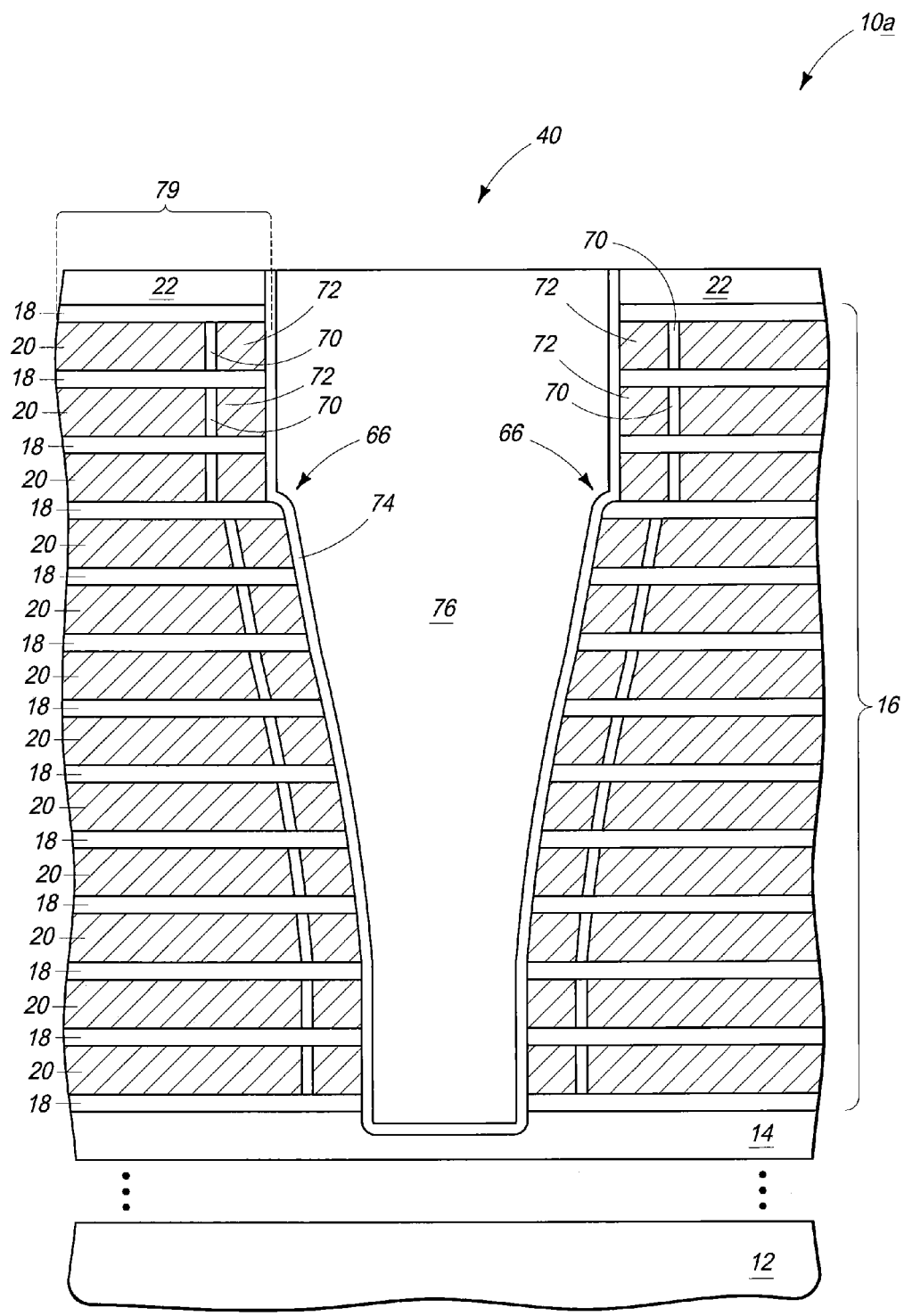

Referring to FIG. 10, gate dielectric 74 is formed to line opening 40, and channel material 76 is formed within the lined opening. The gate dielectric material may comprise any suitable composition or combination of compositions; and in some embodiments may comprise one or more of silicon dioxide, hafnium oxide, zirconium oxide, aluminum oxide, etc. The channel material may comprise any suitable composition or combination of compositions; and in some embodiments may comprise appropriately-doped silicon. The construction of FIG. 10 may comprise vertically-stacked memory cells 79 (only one of which is labeled). In some embodiments, such memory cells may be incorporated into a NAND memory array.

Figure 11:
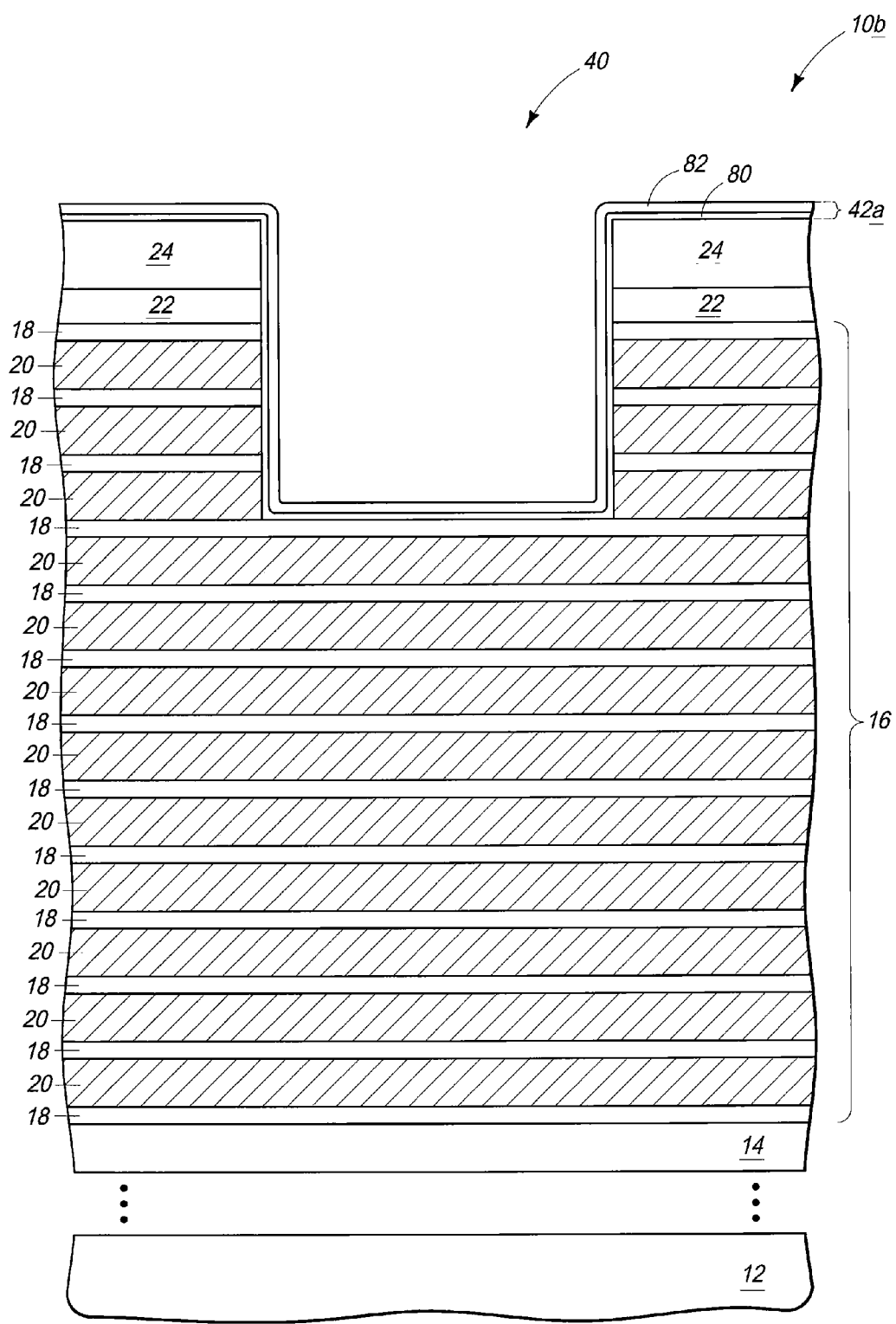
FIGS. 11 and 12 are diagrammatic cross-sectional views of a semiconductor construction at process stages of another example embodiment method of forming integrated structures. The processing stage of FIG. 11 may follow that of FIG. 3.

In some embodiments, a liner of the type shown in FIG. 4 may be formed to comprise two or more compositions. For instance, FIG. 11 shows a construction 10b at a processing stage analogous to that of FIG. 4, but utilizing a liner material 42a comprising two discrete and different compositions 80 and 82. It may be advantageous to utilize multiple different materials in a liner in some embodiments, in that such can provide additional parameters for tailoring liners for specific applications. For instance, in some embodiments it may be advantageous to form the liner 42a to comprise a first composition 80 of polycrystalline silicon, and a second composition 82 of silicon nitride. The silicon nitride may provide advantages for formation of passivation material (analogous to the material 50 described above with reference to FIG. 5), and the polycrystalline silicon may provide advantages in that any residual material can be polycrystalline which may be readily removed during formation of cavities analogous to the cavities 68 described above with reference to FIG. 8. The liner material 42a may be formed to any suitable thickness; and in some embodiments may be formed to a thickness of from greater than 0 nm to less than or equal to about 20 nm. For instance, in some embodiments both of the compositions 80 and 82 may be formed to thicknesses within a range of from greater than 0 nm to less than or equal to about 10 nm.

Figure 12:
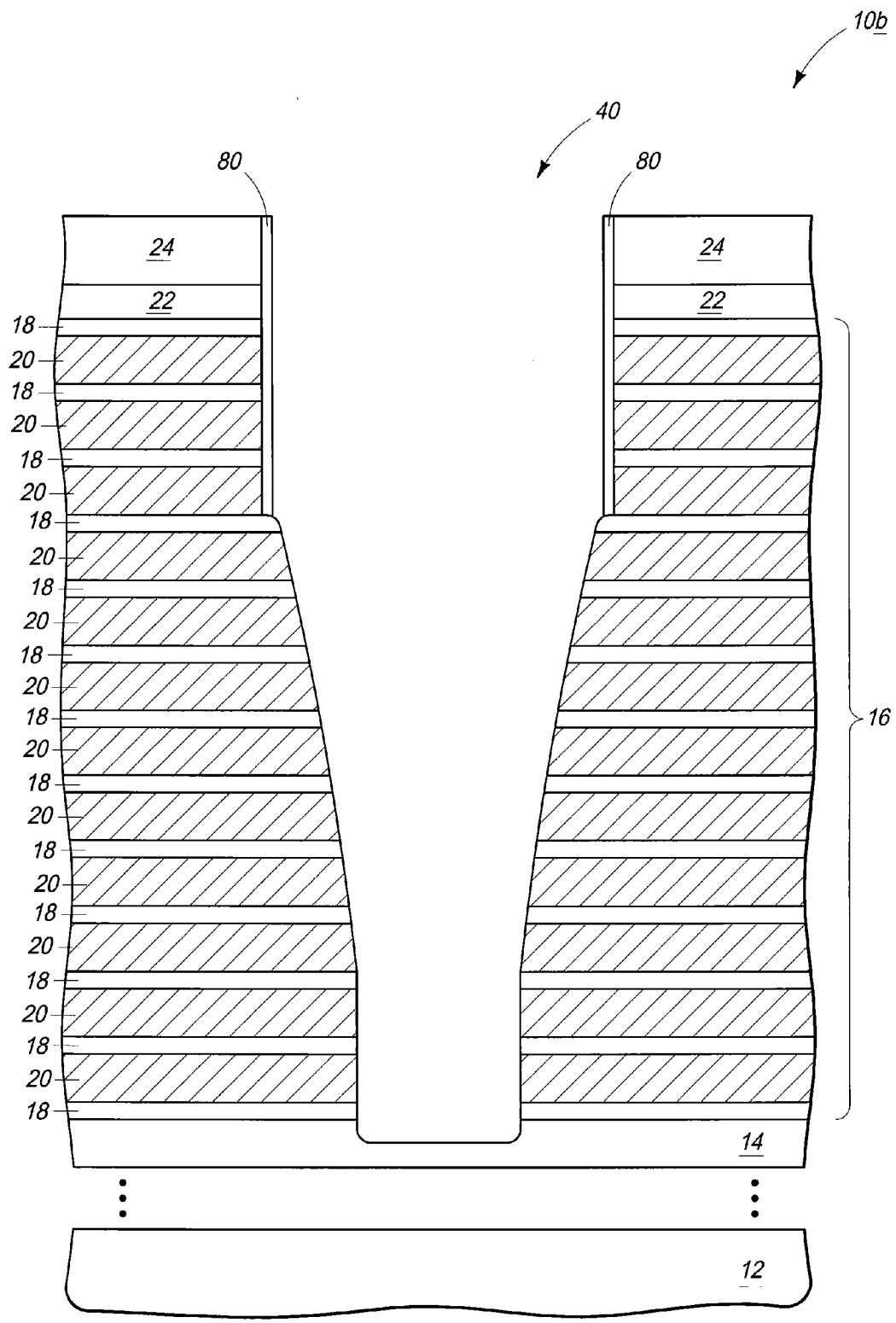

Referring to FIG. 12, construction 10b is shown at a processing stage analogous to that described above with reference to FIG. 7, and specifically is shown after opening 40 is extended through alternating levels 18 and 20 of stack 16. The entirety of composition 82 (FIG. 11) has been consumed during formation of the opening, but some residual of composition 80 remains. If composition 80 comprises polycrystalline silicon, such residual may be removed during anisotropic etching analogous to the etching described above with reference to FIG. 8.

Figure 13:
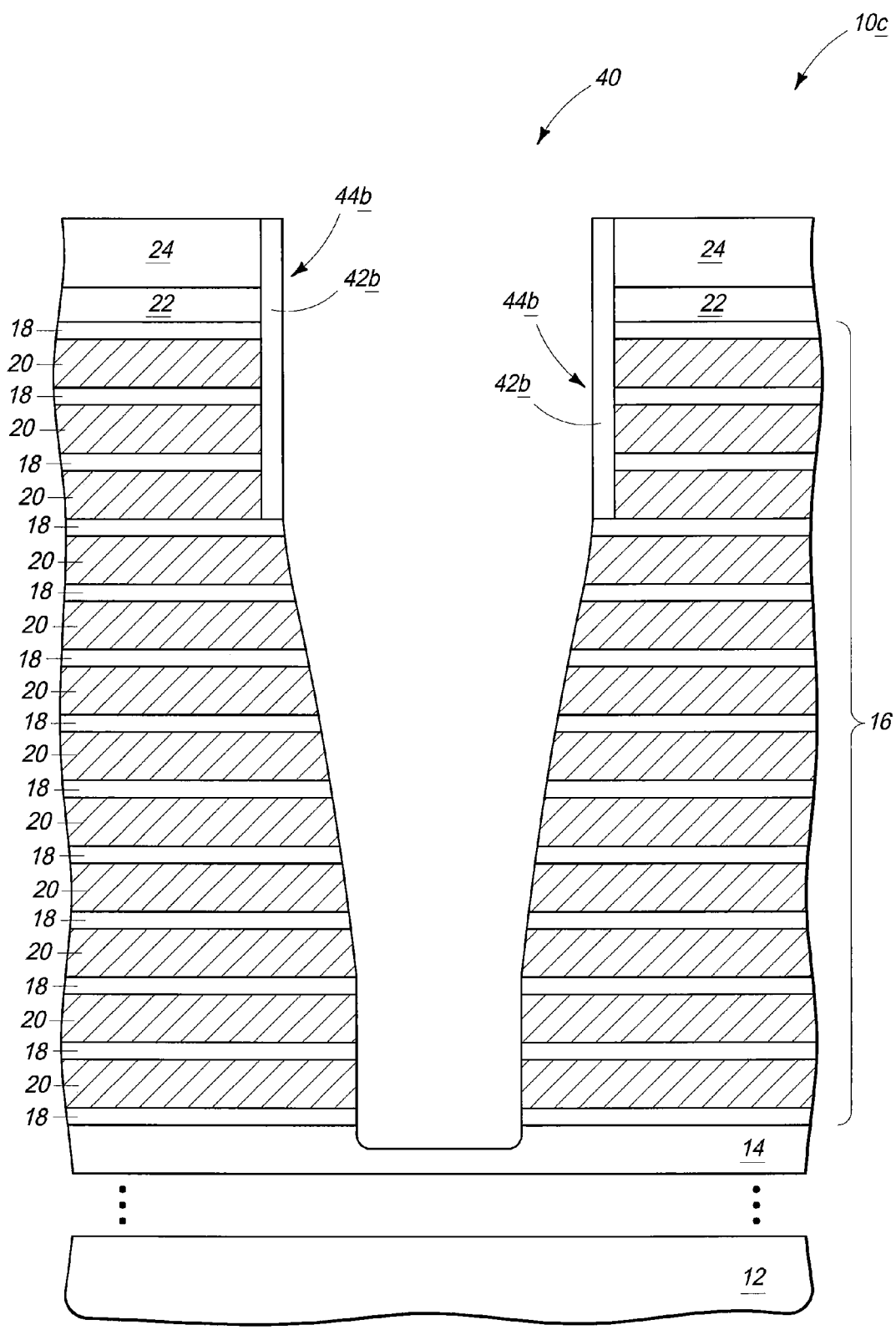
FIGS. 13 and 14 are diagrammatic cross-sectional views of a semiconductor construction at process stages of another example embodiment method of forming integrated structures. The processing stage of FIG. 13 may follow that of FIG. 4.

The embodiments described above utilize liner material which is at least partially consumed as an opening is extended into a stack of alternating levels. In other embodiments, analogous liners may be constructed of materials which are substantially not consumed. For instance, FIG. 13 shows a construction 10c at a processing stage analogous to that of FIG. 7, but utilizing a liner 44b comprising a material 42b which is not consumed during etching into stack 16. The liner 44b may advantageously be very thin (in other words, may have a thickness of from greater than 0 nm to less than or equal to about 20 nm; and in some embodiments may have a thickness of from about 4 nm to about 10 nm); which can enable such liner to be readily removed in subsequent processing. In some embodiments, the liner may comprise a high k oxide; with the term "high k" meaning a dielectric constant greater than that of silicon dioxide. Example high k oxides include aluminum oxide, hafnium oxide, zirconium oxide, hafnium silicate, zirconium silicate, etc.

Figure 14:
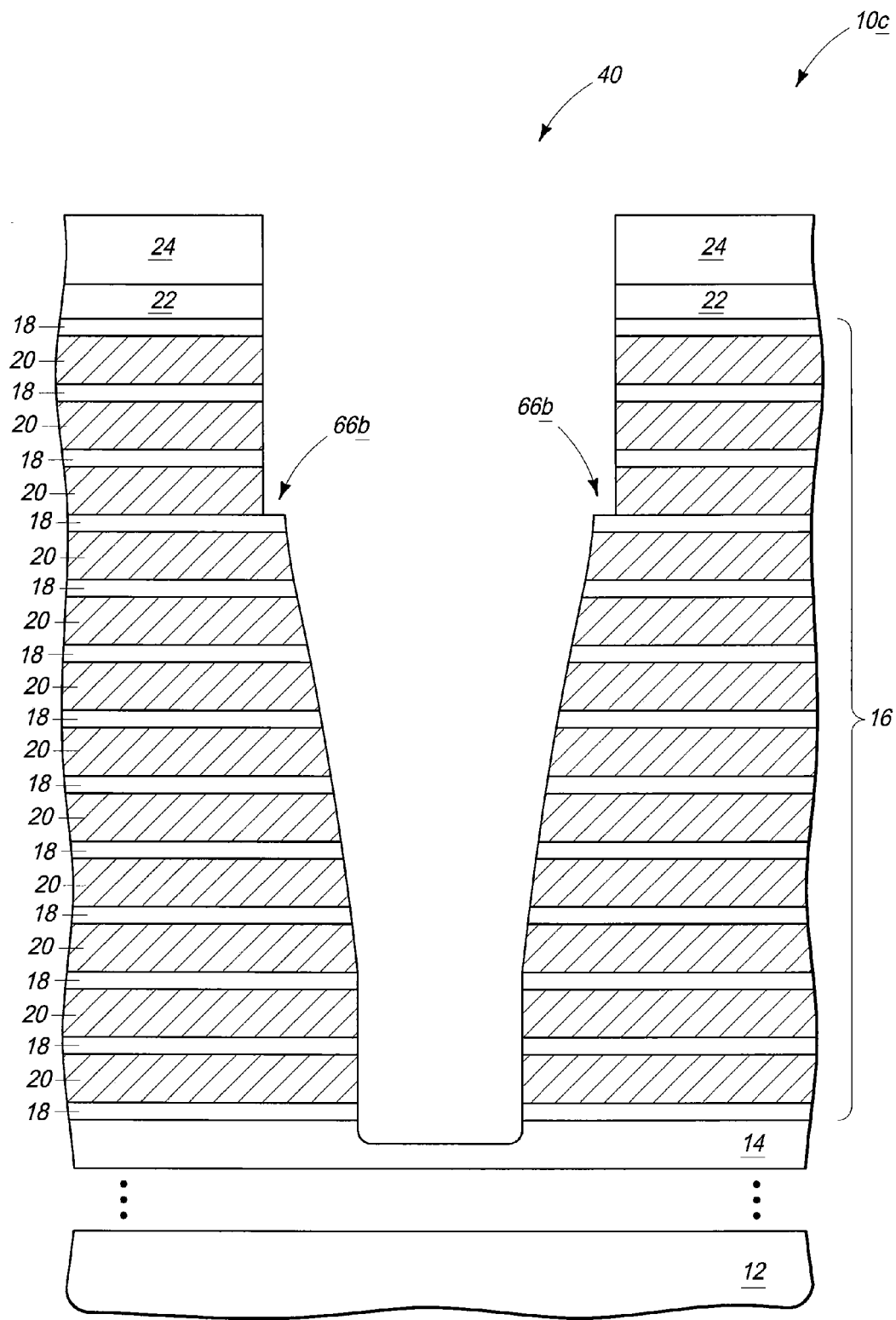

FIG. 14 shows construction 10c at a processing stage subsequent to that of FIG. 13, and after liner 44b (FIG. 13) has been removed. A ridge 66b remains where a bottom of liner 44b (FIG. 13) rested on a level 18. The ridge 66b is analogous to the ridge 66 of FIG. 7, but may have a more angular corner than ridge 66 in some embodiments.

Processing described herein may be utilized for fabrication of high aspect ratio openings through various stacks of materials. In some embodiments, the processing may be utilized for forming high aspect openings through alternating stacks of conductively-doped silicon and silicon dioxide during fabrication of NAND. In other embodiments, the openings may be formed through other alternating stacks. For instance, in some embodiments an alternating stack of silicon nitride and conductively-doped silicon may be patterned (for instance, levels 18 and 20 of FIG. 7 may correspond to silicon nitride and conductively-doped silicon, respectively). In such embodiments, a liner may comprise any of the materials described above as being suitable for liner 44 and/or may comprise silicon dioxide.

The constructions discussed above may be utilized for fabrication of integrated structures which are incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The term "integrated structure" means any structure utilized in integrated circuitry; such as structures supported by silicon chips, and including structures utilized in integrated memory, integrated logic, etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of fabricating integrated structures. An opening is formed to extend partially through a stack of alternating first and second levels. A liner is formed along sidewalls of the opening. The opening is extended into the stack utilizing etching conditions that penetrate the first and second levels and that remove substantially all of the liner.

Some embodiments include a method of fabricating integrated structures. An opening is formed to extend partially through a stack of alternating first and second levels. A liner is formed along sidewalls of the opening. The liner has a thickness within a range of from greater than 0 nanometers to about 20 nanometers. While the liner is along the sidewalls, the opening is extended into the stack.

Some embodiments include a method of fabricating integrated structures. A first opening is formed to extend partially through a stack of alternating first and second levels. A liner is formed along sidewalls of the first opening. The liner has a thickness within a range of from greater than 0 nanometers to about 20 nanometers. The opening is extended into the stack with an etch to form a second opening. The liner is at least partially consumed during the etch and forms passivation material which protects sidewalls of a region of the second opening beneath the liner.

Some embodiments include a method of forming vertically-stacked memory cells. An opening is formed to extend partially through a stack of alternating silicon dioxide levels and conductively-doped silicon levels. A liner is formed along sidewalls of the opening. The stack is etched to extend the opening. The liner is at least partially consumed during the etch and forms passivation material. Three zones occur during the etch, with one of the zones being an upper zone of the opening protected by the liner, another of the zones being an intermediate zone of the opening protected by passivation material but not the liner, and another of the zones being a lower zone of the opening which is not protected by either passivation material or the liner. Cavities are formed to extend into the conductively-doped silicon levels along sidewalls of the opening. Charge blocking dielectric and charge-storage structures are formed within the cavities.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of fabricating integrated structures, comprising:
    forming an opening to extend partially through a stack of alternating first and second levels;
    forming a liner along sidewalls of the opening;
    extending the opening into the stack utilizing etching conditions that penetrate the first and second levels and that remove at least a majority of the liner; and
    wherein the first and second levels comprise silicon dioxide and conductively-doped silicon, respectively; and wherein the liner comprises one or more of tungsten silicide, titanium nitride, silicon nitride, carbon, polycrystalline silicon and oxide having a higher dielectric constant than silicon dioxide.

2. The method of claim 1 wherein the second levels comprise conductively-doped polysilicon.

3. A method of fabricating integrated structures, comprising:
    forming an opening to extend partially through a stack of alternating first and second levels;
    forming a liner along sidewalls of the opening;
    extending the opening into the stack utilizing etching conditions that penetrate the first and second levels and that remove at least a majority of the liner; and
    wherein the first and second levels comprise silicon dioxide and conductively-doped silicon, respectively; wherein the liner comprises silicon nitride; and wherein the etching conditions utilize one or more of HBr, $CH_2F_2$, $CH_4$, $C_2H_2$, $H_2$, $NF_3$, $C_4F_8$, $C_4F_6$, $O_2$, Ar, $CHF_3$, $CH_3F$, $BCl_3$ and $SF_6$.

4. A method of fabricating integrated structures, comprising:
    forming an opening to extend partially through a stack of alternating first and second levels;
    forming a liner along sidewalls of the opening;
    extending the opening into the stack utilizing etching conditions that penetrate the first and second levels and that remove at least a majority of the liner; and
    wherein the first and second levels comprise silicon dioxide and conductively-doped polysilicon, respectively; wherein the liner comprises silicon nitride; and wherein the etching conditions utilize one or more of HBr, $CH_2F_2$, $CH_4$, $C_2H_2$, $H_2$, $NF_3$, $C_4F_8$, $C_4F_6$, $O_2$, Ar, $CHF_3$, $CH_3F$, $BCl_3$ and $SF_6$.

5. A method of fabricating integrated structures, comprising:
    forming an opening to extend partially through a stack of alternating first and second levels;
    forming a liner along sidewalls of the opening; the liner having a thickness within a range of from greater than 0 nanometers to about 20 nanometers;
    while the liner is along the sidewalls, extending the opening into the stack; and
    wherein liner is at least partially consumed during the etch.

6. A method of fabricating integrated structures, comprising:
    forming an opening to extend partially through a stack of alternating first and second levels;
    forming a liner along sidewalls of the opening; the liner having a thickness within a range of from greater than 0 nanometers to about 20 nanometers;
    while the liner is along the sidewalls, extending the opening into the stack; and
    wherein the first and second levels are electrically insulative and electrically conductive, respectively.

7. A method of fabricating integrated structures, comprising:
    forming an opening to extend partially through a stack of alternating first and second levels;
    forming a liner along sidewalls of the opening; the liner having a thickness within a range of from greater than 0 nanometers to about 20 nanometers;
    while the liner is along the sidewalls, extending the opening into the stack; and
    wherein the first and second levels comprise silicon dioxide and conductively-doped silicon, respectively.

8. The method of claim 7 wherein the liner comprises electrically conductive material.

9. The method of claim 8 wherein the liner comprises one or both of tungsten silicide and titanium nitride.

10. The method of claim 7 wherein the liner comprises one or more of silicon nitride, carbon and polycrystalline silicon, respectively.

11. The method of claim 7 wherein the liner comprises an oxide having a dielectric constant greater than that of silicon dioxide.

12. The method of claim 7 wherein the liner comprises one or more of aluminum oxide, hafnium oxide, zirconium oxide, hafnium silicate and zirconium silicate.

13. A method of fabricating integrated structures, comprising:
    forming an opening to extend partially through a stack of alternating first and second levels;
    forming a liner along sidewalls of the opening; the liner having a thickness within a range of from greater than 0 nanometers to about 20 nanometers;
    while the liner is along the sidewalls, extending the opening into the stack; and
    wherein the first and second levels comprise silicon nitride and conductively-doped silicon, respectively.

14. A method of fabricating integrated structures, comprising:
    forming a first opening to extend partially through a stack of alternating electrically conductive levels and electrically insulative levels;

forming a liner along sidewalls of the first opening; the liner having a thickness within a range of from greater than 0 nanometers to about 20 nanometers; and extending the opening into the stack with an etch to form a second opening; the liner being at least partially consumed during the etch and forming passivation material which protects sidewalls of a region of the second opening beneath the liner.

15. The method of claim 14 wherein the liner is entirely consumed during the etch.

16. The method of claim 14 wherein the liner is only partially consumed during the etch.

17. The method of claim 14 wherein the liner comprises one or more of silicon nitride, carbon, titanium nitride, tungsten silicide and polycrystalline silicon, respectively.

18. The method of claim 14 wherein the liner comprises silicon nitride over polycrystalline silicon; and wherein the silicon nitride is entirely consumed during the etch.

19. The method of claim 14 wherein the electrically conductive levels and electrically insulative levels comprise conductively-doped silicon and silicon dioxide, respectively.

20. A method of forming vertically-stacked memory cells, comprising:

forming an opening to extend partially through a stack of alternating silicon dioxide levels and conductively-doped silicon levels;

forming a liner along sidewalls of the opening;

etching into the stack to extend the opening; the liner being at least partially consumed during the etch and forming passivation material; three zones occurring during the etch, with one of the zones being an upper zone of the opening protected by the liner, another of the zones being an intermediate zone of the opening protected by passivation material but not the liner, and another of the zones being a lower zone of the opening which is not protected by either passivation material or the liner;

forming cavities extending into the conductively-doped silicon levels along sidewalls of the opening; and forming charge blocking dielectric and charge-storage structures within the cavities.

21. The method of claim 20 wherein the liner is entirely consumed during the etch.

22. The method of claim 20 wherein the liner is only partially consumed during the etch.

23. The method of claim 20 wherein the liner comprises electrically conductive material and is entirely consumed during the etch.

24. method of claim 20 wherein the liner comprises one or more of silicon nitride, carbon and polycrystalline silicon.

25. The method of claim 20 wherein the liner comprises silicon nitride over polycrystalline silicon; wherein the silicon nitride is entirely consumed during the etch but at least some of the polycrystalline of the liner remains after the etch; and wherein the remaining polycrystalline silicon of the liner is removed during the formation of the cavities.

26. The method of claim 20 wherein a ridge forms at a base of the liner and remains after the etch.

* * * * *

UNITED STATES PATENT AND TRADEMARK OFFICE
CERTIFICATE OF CORRECTION

PATENT NO. : 8,946,076 B2
APPLICATION NO. : 13/835551
DATED : February 3, 2015
INVENTOR(S) : Fatma Arzum Simsek-Ege et al.

Page 1 of 1

It is certified that error appears in the above-identified patent and that said Letters Patent is hereby corrected as shown below:

In the Claims

In column 12, line 19, in Claim 24, before "method" insert -- The --.

Signed and Sealed this
Fifth Day of May, 2015

Michelle K. Lee
*Director of the United States Patent and Trademark Office*